United States Patent
Beom et al.

(10) Patent No.: US 8,564,008 B2
(45) Date of Patent: Oct. 22, 2013

(54) LIGHT EMITTING DEVICE AND LIGHT EMITTING DEVICE PACKAGE

(75) Inventors: Hee Young Beom, Seoul (KR); Min Gyu Na, Seoul (KR)

(73) Assignee: LG Innotek Co. Ltd., Seoul (KR)

(*) Notice: Subject to any disclaimer, the term of this patent is extended or adjusted under 35 U.S.C. 154(b) by 78 days.

(21) Appl. No.: 13/073,381

(22) Filed: Mar. 28, 2011

(65) Prior Publication Data
US 2011/0233590 A1 Sep. 29, 2011

(30) Foreign Application Priority Data
Mar. 29, 2010 (KR) .................. 10-2010-0027773

(51) Int. Cl.
*H01L 33/00* (2010.01)

(52) U.S. Cl.
USPC 257/99; 257/98; 257/E33.005; 257/E33.055; 257/E33.068

(58) Field of Classification Search
CPC ........ H01L 33/62; H01L 33/486; H01L 33/38
USPC ................ 257/98, E33.005, E33.068, 79, 99, 257/E33.055; 977/755
See application file for complete search history.

(56) References Cited

U.S. PATENT DOCUMENTS

| | | | | |
|---|---|---|---|---|
| 4,385,366 A | * | 5/1983 | Housey, Jr. ................. | 345/170 |
| 5,557,115 A | * | 9/1996 | Shakuda ..................... | 257/81 |
| 5,563,422 A | * | 10/1996 | Nakamura et al. .......... | 257/13 |
| 8,217,407 B2 | | 7/2012 | Wantanabe et al. | |
| 2004/0046499 A1 | | 3/2004 | Park et al. | |
| 2006/0113901 A1 | | 6/2006 | Oh et al. | |
| 2007/0096115 A1 | | 5/2007 | Lee et al. | |
| 2007/0108460 A1 | * | 5/2007 | Lee et al. ................. | 257/98 |
| 2007/0292978 A1 | * | 12/2007 | Yeh et al. ................. | 438/22 |
| 2009/0302750 A1 | | 12/2009 | Jun et al. | |
| 2010/0051987 A1 | | 3/2010 | Katsuno et al. | |
| 2010/0193826 A1 | | 8/2010 | Kim | |

FOREIGN PATENT DOCUMENTS

CN 1953225 4/2007
CN 101188267 5/2008

OTHER PUBLICATIONS

Margalith et al., "Indium tin oxide contacts to . . . ", 1999, Applied Physics Letters, vol. 74, No. 26, pp. 3930-3933.*
Ejder, "Refraction Index of GaN", 1971, Phys. Stat. Sol., (a) vol. 6, pp. 445-448.*

* cited by examiner

*Primary Examiner* — Nikolay Yushin
(74) *Attorney, Agent, or Firm* — McKenna Long & Aldridge LLP (57) ABSTRACT

Provided are a light emitting device, a method for fabricating the light emitting device, a light emitting device package, and a lighting system. The light emitting device includes a first conductive type semiconductor layer having a first top surface and a second top surface under the first top surface, an active layer on the first top surface of the first conductive type semiconductor layer, a second conductive type semiconductor layer on the active layer, a first electrode on the second top surface of the first conductive type semiconductor layer, an intermediate refractive layer on the second top surface of the first conductive type semiconductor layer, and a second electrode connected to the second conductive type semiconductor layer.

25 Claims, 7 Drawing Sheets

LIGHT EMITTING DEVICE AND LIGHT EMITTING DEVICE PACKAGE

CROSS-REFERENCE TO RELATED APPLICATIONS

The present application claims priority under 35 U.S.C. 119 and 35 U.S.C. 365 to Korean Patent Application No. 10-2010-0027773 filed on Mar. 29, 2010, which is hereby incorporated by reference in its entirety as if fully set forth herein.

BACKGROUND

Embodiments relate to a light emitting device, a method for fabricating the light emitting device, and a light emitting device package.

Light emitting diodes (LEDs) are semiconductor light emitting devices that convert current into light. As luminance of LEDs is increased recently, the LEDs are being used as light sources for displays, vehicles, and illuminations. Also, LEDs emitting highly efficient white light may be realized by using a fluorescent substance or combining LEDs having various colors.

To improve bright and performance of LEDs, various methods such as a method of improving a light extraction structure, a method of improving a structure of an active layer, a method of improving current spreading, a method of improving an electrode structure, and a method of improving a structure of a light emitting diode package may be being attempted.

SUMMARY

Embodiments provide a light emitting device having a new structure, a method for fabricating the light emitting device, and a light emitting device package.

Embodiments also provide a light emitting device having improved light extraction efficiency and a method for fabricating the light emitting device.

In one embodiment, a light emitting device includes: a first conductive type semiconductor layer having a first top surface and a second top surface under the first top surface; an active layer on the first top surface of the first conductive type semiconductor layer; a second conductive type semiconductor layer on the active layer; a first electrode on the second top surface of the first conductive type semiconductor layer; an intermediate refractive layer on the second top surface of the first conductive type semiconductor layer; and a second electrode connected to the second conductive type semiconductor layer, wherein the intermediate refractive layer is formed of a conductive material and spaced from the second electrode.

In another embodiment, a method for fabricating a light emitting device, the method includes: sequentially stacking a conductive type semiconductor layer, an active layer, and a second conductive type semiconductor layer to form a light emitting structure; performing a mesa etching process on the light emitting structure to expose a portion of a top surface of the first conductive type semiconductor layer; forming an intermediate refractive layer on the exposed top surface of the first conductive type semiconductor layer; and forming a first electrode on the exposed top surface of the first conductive type semiconductor layer, wherein the first electrode is spaced from the intermediate refractive layer inside the exposed top surface of the first conductive type semiconductor layer.

In further another embodiment, a light emitting device package includes: a body; first and second electrode layers on the body; a light emitting device on the body, the light emitting device being electrically connected to the first and second electrode layers; and a molding member covering the light emitting device, wherein the light emitting device includes: a first conductive type semiconductor layer having a first top surface and a second top surface under the first top surface; an active layer on the first top surface of the first conductive type semiconductor layer; a second conductive type semiconductor layer on the active layer; a first electrode on the second top surface of the first conductive type semiconductor layer; an intermediate refractive layer on the second top surface of the first conductive type semiconductor layer; and a second electrode connected to the second conductive type semiconductor layer, wherein the intermediate refractive layer has a refractive index between a refractive index of the first conductive type semiconductor layer and a refractive index of the molding member.

The details of one or more embodiments are set forth in the accompanying drawings and the description below. Other features will be apparent from the description and drawings, and from the claims.

DETAILED DESCRIPTION OF THE EMBODIMENTS

In the descriptions of embodiments, it will be understood that when a layer (or film), a region, a pattern, or a structure is referred to as being 'on' a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, a light emitting device, a method for fabricating the light emitting device, a light emitting device package, and a lighting unit according to an embodiment will be described with reference to accompanying drawings.

Figure 1:
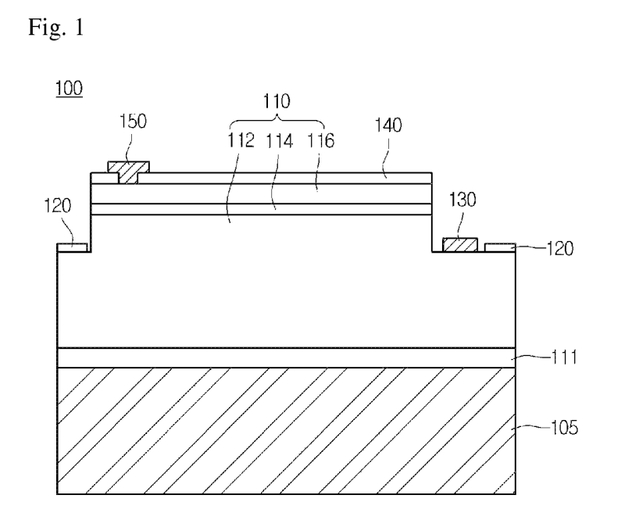
FIG. 1 is a side sectional view of a light emitting device according to an embodiment.
Figure 2:
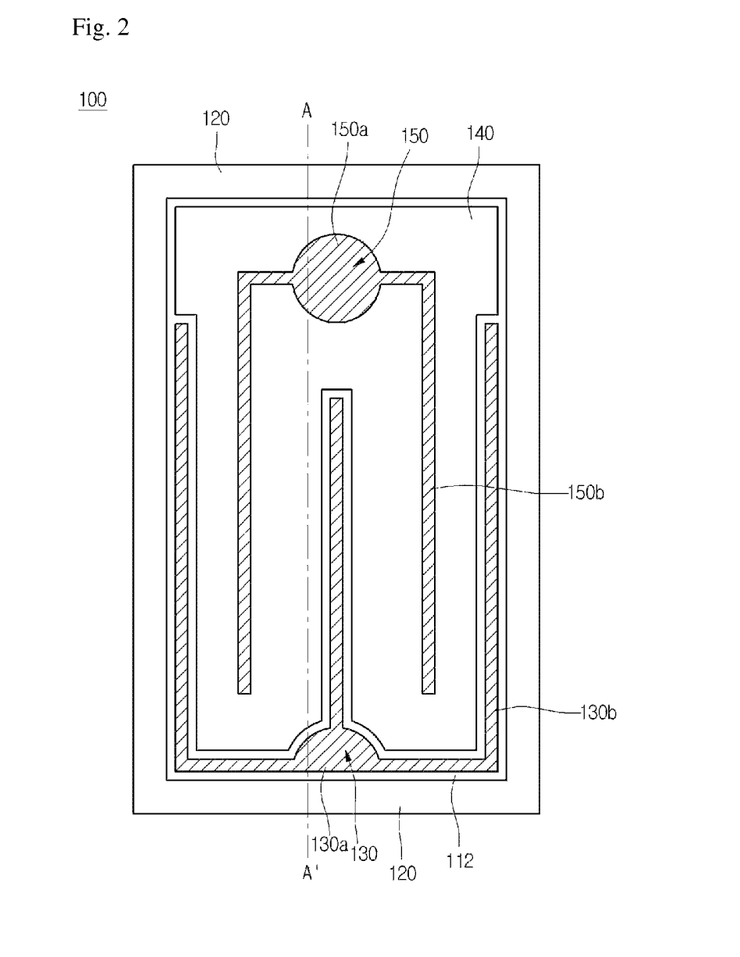
FIG. 2 is a top view illustrating the light emitting device of FIG. 1.

FIG. 1 is a side sectional view of a light emitting device 100 according to an embodiment, and FIG. 2 is a top view illustrating the light emitting device 100 of FIG. 1. FIG. 1 is a sectional view taken along line A-A' of FIG. 2.

Referring to FIGS. 1 and 2, the light emitting device 100 according to an embodiment may includes a substrate 105, a buffer layer 111 on the substrate 105, a first conductive type semiconductor layer 112 on the buffer layer 111, an active layer 114 disposed on the first conductive type semiconductor layer 112 to expose a portion of a top surface of the first conductive type semiconductor layer 112, a second conductive type semiconductor layer 116 on the active layer 114, a first electrode 130 on the exposed first conductive type semiconductor layer 112, an intermediate refractive layer 120 around the first electrode 130 disposed on the exposed first conductive type semiconductor layer 112, a second electrode 150 on the second conductive type semiconductor layer 116, and a transparent electrode layer 140.

The first conductive type semiconductor layer 112, the active layer 114, and the second conductive type semiconductor layer 116 may constitute a light emitting structure 110 for emitting light.

For example, the substrate 105 may be formed of at least one of sapphire (Al2O3), SiC, GaAs, GaN, ZnO, Si, GaP, InP, and Ge, but is not limited thereto.

The substrate 105 may have an inclined top surface or a pattern may be disposed on the top surface of the substrate 105 to smoothly grow the light emitting structure 110 and improve light extraction efficiency of the light emitting device 100.

The buffer layer 111, the first conductive type semiconductor layer 112, the active layer 114, and the second conductive type semiconductor layer 116 may be sequentially stacked on each other. However, the present disclosure is not limited to the layers.

The light emitting structure may be formed of a group III-V compound semiconductor, e.g., one of AlInGaN-based, GaAs-based, GaAsP-based, and GaP-based compound semiconductor materials. Electrons and holes supplied from the first and second conductive type semiconductor layers 130 and 150 may be recombined in the active layer 114 to generate light.

The buffer layer 111 is a layer for reducing a lattice constant difference and a thermal expansion coefficient difference between the substrate 105 and the light emitting structure 110. A lattice constant or/and a thermal expansion coefficient of the buffer layer 111 may be between lattice constants or/and thermal expansion coefficients of the substrate 105 and the light emitting structure 110. The buffer layer 111 may have a single- or multi-layered structure. Also, the buffer layer 111 may be formed of a compound semiconductor material, e.g., one of GaN, AN, AlGaN, InGaN, InN, InAlGaN, AlInN, AlGaAs, GaP, GaAs, GaAsP, and AlGaInP.

The first conductive type semiconductor layer 112 may be formed of a group III-V compound semiconductor, which is doped with a first conductive type dopant, e.g., one of GaN, AN, AlGaN, InGaN, InN, InAlGaN, AlInN, AlGaAs, GaP, GaAs, GaAsP, and AlGaInP. When the first conductive type semiconductor layer 112 is an N-type semiconductor layer, the first conductive type dopant may include an N-type dopant such as Si, Ge, Sn, Se, or Te. Also, the first conductive type semiconductor layer 112 may have a single- or multi-layered structure.

The active layer 114 may be disposed on the first conductive type semiconductor layer 112. Here, the active layer 114 may be disposed on the first conductive type semiconductor layer 112 to expose a portion of the top surface of the first conductive type semiconductor layer 112. For example, this structure may be formed by performing a mesa etching process on the light emitting structure 110 after the light emitting structure 110 is formed, but is not limited thereto.

The active layer 114 is a layer in which electrons injected through the first conductive type semiconductor layer 112 and holes injected through the second conductive type semiconductor layer 116 are met with each other to emit light having a wavelength band determined by a proper energy band of the compound semiconductor layer material.

The active layer 140 may have one of a single quantum well structure, a multi quantum well (MQW) structure, a quantum dot structure, or a quantum wire structure.

For example, when the active layer 114 has the quantum well structure, the active layer 114 may have a single or multi quantum well structure including a well layer having a compositional formula of $In_xAl_yGa_{1-x-y}N$ ($0 \le x \le 1$, $0 \le y \le 1$, $0 \le x+y \le 1$) and a barrier layer having a compositional formula of $In_aAl_bGa_{1-a-b}N$ ($0 \le a \le 1$, $0 \le b \le 1$, $0 \le a+b \le 1$). The well layer may be formed of a material having an energy band gap less than that of the barrier.

The active layer 114 may generate light using energy generated in a process in which the electrons and holes supplied from the first and second conductive type semiconductor layers 112 and 116 are recombined with each other.

Also, a conductive type clad layer may be disposed on or/and under the active layer 114. The conductive type clad layer may be formed of an AlGaN-based semiconductor.

The second conductive type semiconductor layer 116 may be disposed on the active layer 114. The second conductive type semiconductor layer 116 may be formed of a group III-V compound semiconductor, which is doped with a second conductive type dopant, e.g., one of GaN, AN, AlGaN, InGaN, InN, InAlGaN, AlInN, AlGaAs, GaP, GaAs, GaAsP, and AlGaInP. When the second conductive type semiconductor layer 116 is a P-type semiconductor layer, the second conductive type dopant may include a P-type dopant such as Mg or Zn. Also, the second conductive type semiconductor layer 116 may have a single- or multi layered structure.

The first electrode 130 may be disposed on the top surface of the exposed first conductive type semiconductor layer 112, and the intermediate refractive layer 120 may be disposed around the first electrode 130 disposed on the top surface of the first conductive type semiconductor layer 112.

The first electrode 130 may include an electrode pad 130a bonded to a wire and electrode wings 130b branched from the electrode pad 130a to spread a current.

For example, the first electrode 130 may be formed of a metal or a metal alloy containing at least one of Cu, Cr, Au, Al, Ag, Sn, Ni, Pt, and Pd. Also, the first electrode 130 may have a single- or multi-layered structure.

The intermediate refractive layer 120 may be disposed around the first electrode 130 on the first conductive type semiconductor layer 112. The intermediate refractive layer 120 may be physically separated from the first electrode 130 or partially contacts the first electrode 130, but is not limited thereto.

Since the intermediate refractive layer 120 has a thickness less than that of a stepped portion of the first conductive type semiconductor layer 112, the intermediate refractive layer does not contact the active layer 114 and the second conductive type semiconductor layer 116 on the active layer.

The intermediate refractive layer 120 may be formed of a material having a refractive index between a refractive index of the first conductive type semiconductor layer 112 and a refractive index of a material surrounding the light emitting device 100, e.g., a refractive index of air (refractive index: about 1.0) or silicon and a resin material (refractive index: about 1.4 to about 1.5).

The intermediate refractive layer 120 may be formed of a light-transmitting conductive material, e.g., at least one of ITO and light-transmitting conductive materials, having a refractive index similar to that of the ITO, such as indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), and gallium zinc oxide (GZO).

Since the intermediate refractive layer 120 has a refractive index between a refractive index of the first conductive type semiconductor layer 112 and a refractive index of the material surrounding the light emitting device 100, an amount of light extracted to the outside of the light emitting structure 110 may be increased.

In detail, as a refractive index difference of interfaces between materials different from each other is gradually increased, an amount of light totally reflected by the interfaces is increased. Thus, since the light emitting device 100 according to an embodiment includes the intermediate refractive layer between the first conductive type semiconductor layer 112 and the material surrounding the light emitting device 100, an amount of light confined within the light emitting structure 110 by the total reflection may be increased by reducing the refractive index difference between the interfaces.

Referring to FIG. 2, the intermediate refractive layer 120 may cover almost all regions on the top surface of the exposed first conductive type semiconductor layer 112 except a region in which the first electrode 130 is disposed. However, a configuration of the light emitting device illustrated in FIG. 2 may be viewed as only an example, and thus, the present disclosure is not limited thereto.

The intermediate refractive layer 120 may be disposed along the exposed top surface of the first conductive type semiconductor layer 112. The exposed top surface of the first conductive type semiconductor layer 112 may have a loop shape, e.g., a continuous loop shape or a discontinuous loop shape, but is not limited thereto. The exposed top surface of the first conductive type semiconductor layer 112 may be partially uneven or inclined, but is not flat. However, the present disclosure is not limited thereto.

When the intermediate refractive layer 120 is formed of a material which forms ohmic contact with the first conductive type semiconductor layer 112, the intermediate refractive layer 120 may spread a current into the first conductive type semiconductor layer 112.

The second electrode 150 and the transparent electrode layer 140 may be disposed on the second conductive type semiconductor layer 116.

The transparent electrode layer 140 may be formed of a light-transmitting material, which ohmic-contacts the second conductive type semiconductor layer 116. For example, the transparent electrode layer 140 may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni, Ag, Ni/IrOx/Au, and Ni/IrOx/Au/ITO. Also, the transparent electrode layer 140 may have a single- or multi-layered structure.

The transparent electrode layer 140 may be formed of the same material as that of the intermediate refractive layer 120, but is not limited thereto. In this case, since the transparent electrode layer 140 and the intermediate refractive layer 120 may be formed through one process at the same time, fabrication processes may be efficiently performed.

The second electrode 150 may be disposed on the transparent electrode layer 140 or the second conductive type semiconductor layer 116 and the transparent layer 140 so that a portion of a bottom surface of the second electrode 150 directly contacts the second conductive type semiconductor layer 116, but is not limited thereto.

For example, the second electrode 150 may be formed of a metal or a metal alloy containing at least one of Cu, Cr, Au, Al, Ag, Sn, Ni, Pt, and Pd.

The first and second electrodes 130 and 150 may be electrically connected to an external power source to provide a power to the light emitting device 100 according to an embodiment.

The intermediate refractive layer 120 may have a width of about 5 µm to about 100 µm. This range may be varied according to a chip size.

Here, the exposed top surface of the first conductive type semiconductor layer 112 may have an area greater than the sum of an area of the intermediate refractive layer 120 and an area of a top surface of the first electrode 130. Also, a top surface of the intermediate refractive layer 120 may have an area greater than that of the top surface of the first electrode 130.

The first conductive type semiconductor layer 112 may include a P-type semiconductor layer, and the second conductive type semiconductor layer 116 may include an N-type semiconductor layer. Also, a third conductive type semiconductor layer (not shown) having a polarity opposite to that of the second conductive type semiconductor layer 116 may be disposed on the second conductive type semiconductor layer 116. Thus, the light emitting device 100 may have at least one of an np junction structure, a pn junction structure, an npn junction structure, and a pnp junction structure, but is not limited thereto.

Figure 3:
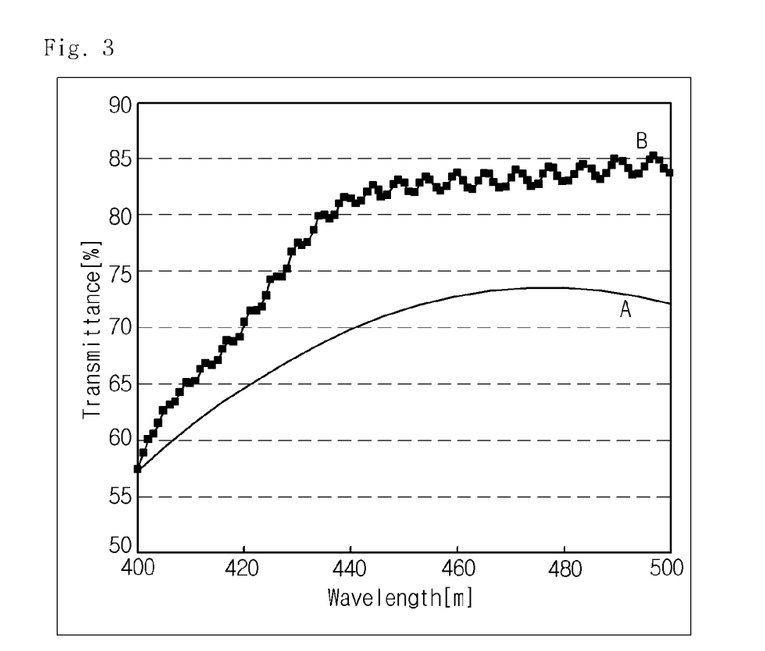
FIGS. 3 and 4 are graphs illustrating results of comparing light transmittance of the light emitting device according to an embodiment to light transmittance of a light emitting device according to a comparative example.
Figure 4:
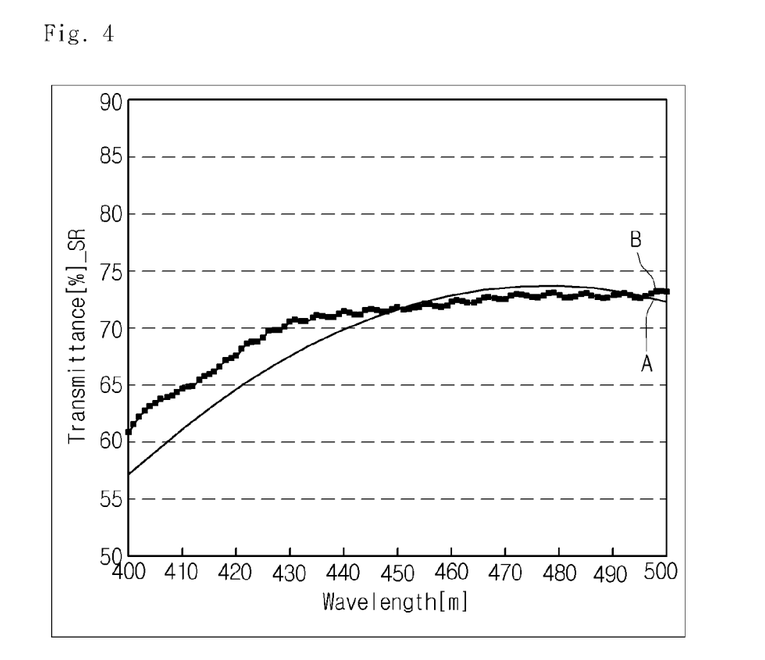

FIGS. 3 and 4 are graphs illustrating results of comparing light transmittance of the light emitting device 100 according to an embodiment B to light transmittance of a light emitting device according to a comparative example A. In FIGS. 3 and 4, an x-axis represents a wavelength of light emitted from the active layer 114, and a y-axis represents light transmittance.

The light emitting devices 100 of FIGS. 3 and 4 have the same structure as each other except a thickness of the intermediate refractive layer 120. In FIG. 3, the intermediate refractive layer 120 has a thickness of about 60 nm. In FIG. 4, the intermediate refractive layer 120 has a thickness of about 100 nm.

Also, the light emitting device according to the comparative example A is equal to that according to the embodiment B except existence or nonexistence of the intermediate refractive layer 120. Also, the light emitting devices according to the embodiment B and the comparative example A emit blue-based light having a main wavelength of about 460 nm. The intermediate refractive layer 120 may be formed of ITO having a refractive index about 2.0.

Referring to FIGS. 3 and 4, it is seen that the light emitting device 100 according to the embodiment B including the intermediate refractive layer 120 has improved light transmittance (see FIG. 3) than that of the light emitting device according to the comparative example A or at least the same light transmittance as that of the light emitting device according to the comparative example A (see FIG. 4).

Also, to maximize an effect due to the intermediate refractive layer 120, the intermediate refractive layer may be adequately adjusted in thickness.

For example, the effect may be maximized when the intermediate refractive layer 120 has a thickness corresponding to integer number times of $\lambda/4n$ (where, $\lambda$: wavelength of light emitted from the active layer, n: refractive index of the intermediate refractive layer).

Thus, when light has a main wavelength of about 460 nm and the intermediate refractive layer 120 is formed of ITO (refractive index of about 2.0) as shown in the embodiment B, the light transmittance of the light emitting device 100 may improved when compared to the light emitting device 100 in which the intermediate refractive layer 120 has a thickness of about 460 nm/(4*2.0)=57.7 60 nm.

Hereinafter, a process of fabricating the light emitting device 100 according to an embodiment will be described in detail. However, descriptions duplicated with the foregoing descriptions will be omitted or simply described.

FIGS. 5 to 8 are views for explaining a process for fabricating a light emitting device 100 according to an embodiment.

Figure 5:
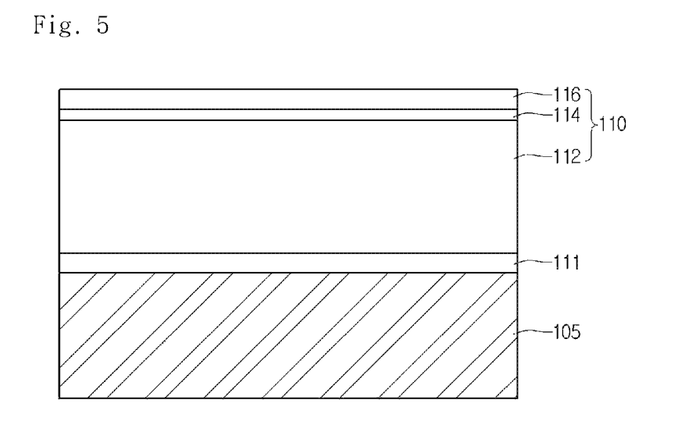
FIGS. 5 to 8 are views for explaining a process for fabricating a light emitting device according to an embodiment.

Referring to FIG. 5, a buffer layer 111 and a light emitting structure 110 may be formed on a substrate 105.

For example, the buffer layer 111 and the light emitting structure 110 may be formed using at least one of a metal organic chemical vapor deposition (MOCVD) process, a chemical vapor deposition (CVD) process, a plasma-enhanced chemical vapor deposition (PECVD) process, a molecular beam epitaxy (MBE) process, and a hydride vapor phase epitaxy (HVPE) process, but is not limited thereto.

Figure 6:
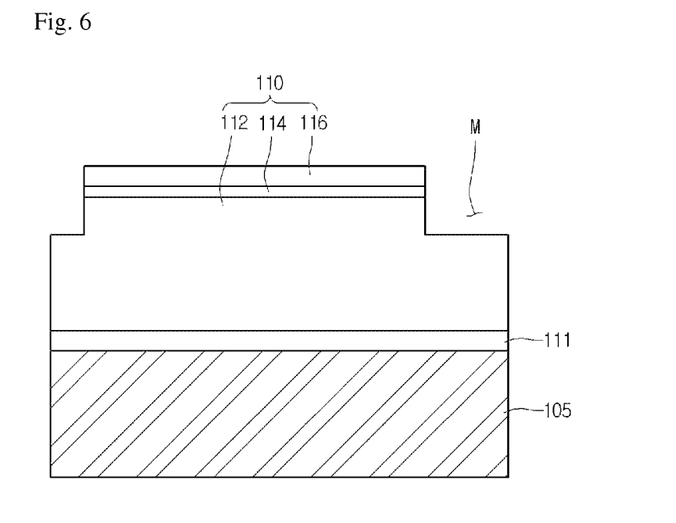

Referring to FIG. 6, a mesa etching process M may be performed on the light emitting structure 110 to expose a portion of a top surface of a first conductive type semiconductor layer 112.

For example, a dry etching process such as an inductively coupled plasma process may be used as the mesa etching process, but is not limited thereto.

Figure 7:
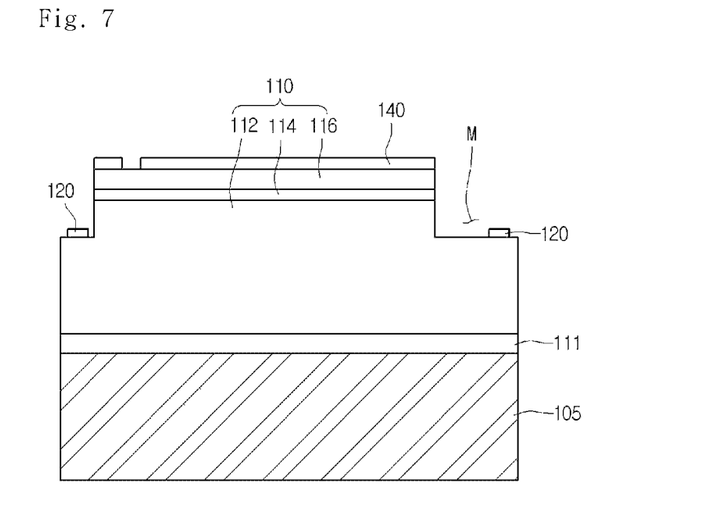

Referring to FIG. 7, an intermediate refractive layer 120 may be formed on the exposed first conductive type semiconductor layer 112, and a transparent electrode layer 140 may be formed on a second conductive type semiconductor layer 116.

When the intermediate refractive layer 120 and the transparent electrode layer 140 are formed of the same material as each other, the intermediate refractive layer 120 and the transparent electrode layer 140 may be formed through one process at the same time. Thus, the manufacturing processes of the light emitting device 100 may be efficiently performed.

For example, a pattern mask may be formed on the light emitting structure 110, and then, a deposition process may be performed along the pattern mask to form the intermediate refractive layer 120 and the transparent electrode layer 140. For example, the deposition process may include an E-beam deposition process, a sputtering process, and a plasma enhanced chemical vapor deposition (PECVD) process, but is not limited thereto.

Figure 8:
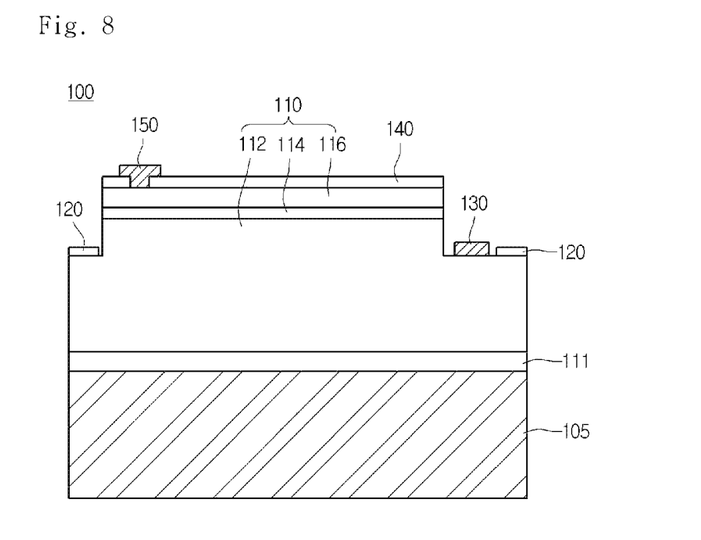

Referring to FIG. 8, a first electrode 130 may be formed around the intermediate refractive layer 120 on the exposed first conductive type semiconductor layer 112, and a second electrode 150 may be formed on the second conductive type semiconductor layer 116 to realize the light emitting device 100 according to an embodiment.

The first and second electrodes 130 and 150 may be formed by a deposition or plating process, but is not limited thereto.

Figure 9:
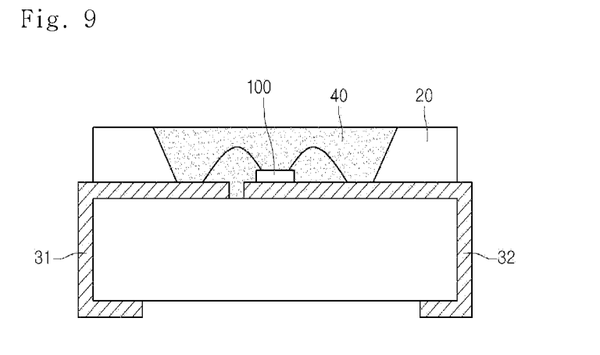
FIG. 9 is a side sectional view of a light emitting device package including a light emitting device according to an embodiment.

FIG. 9 is a side sectional view of a light emitting device package including a light emitting device 100 according to an embodiment.

Referring to FIG. 9, a light emitting device package include a body 10, first and second electrode layers 31 and 32 disposed on the body 10, a light emitting device 100 disposed on the body 10 and electrically connected to the first and second electrode layers 31 and 32, and a molding member 40 surrounding the light emitting device 100.

The body 10 may be formed of a silicon material, a synthetic resin material, or a metal material. An inclined surface may be disposed around the light emitting device 100.

The first electrode layer 31 and the second electrode layer 32 may be electrically separated from each other and provide a power to the light emitting device 100. Also, the first and second electrode layers 31 and 32 may reflect light generated in the light emitting device 100 to improve light efficiency. In addition, the first and second electrode layers 31 and 32 may discharge heat generated in the light emitting device 100 to the outside.

The light emitting device 100 may be disposed on the body 10 or the first or second electrode layer 31 or 32.

The light emitting device 100 may be electrically connected to the first and second electrode layers 31 and 32 through one of a wire-bonding method, a flip-chip method, and a die-bonding method.

The molding member 40 may surround the light emitting device 100 to protect the light emitting device 100. Also, a phosphor may be contained in the molding member 40 to change a wavelength of light emitted from the light emitting device 100.

Figure 10:
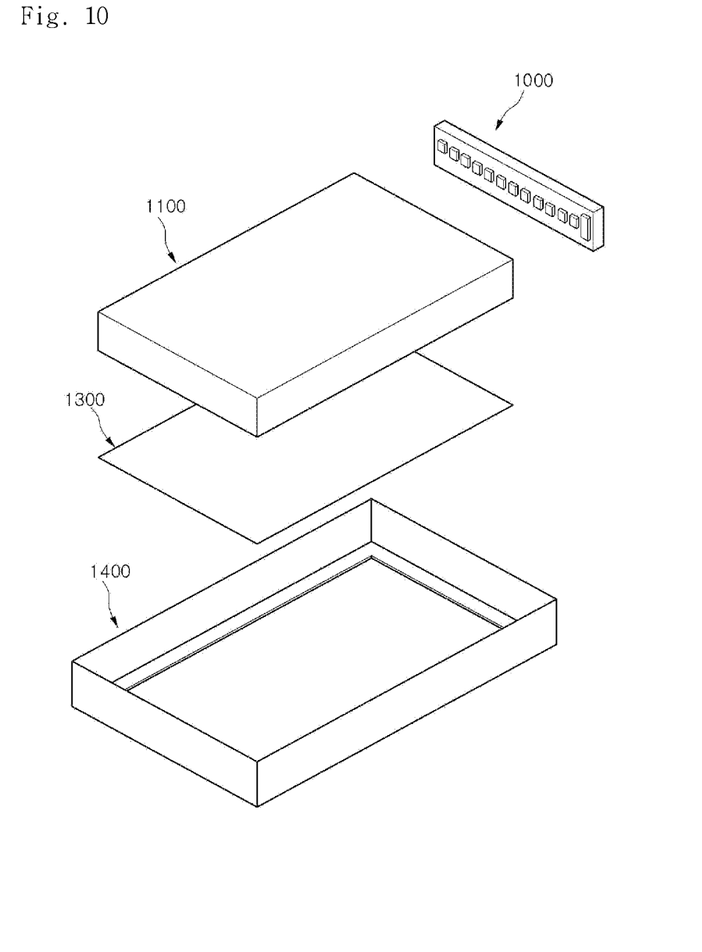
FIGS. 10 and 11 are views of a lighting unit using a light emitting device according to an embodiment.

FIG. 10 is a view of a lighting unit using a light emitting device according to an embodiment. The backlight unit of FIG. 10 is an example of a lighting unit, but is not limited thereto.

Referring to FIG. 10, the backlight unit may include a bottom cover 1400, a light guide member 1100 disposed within the bottom cover 1400, and a light emitting module 1000 disposed on at least one side surface or a bottom surface of the light guide member 1100. Also, a reflective sheet 1300 may be disposed under the light guide member 1110.

The bottom cover 1400 may have an upwardly opened box shape to receive the light guide member 1100, the light emitting module 1000, and the reflective sheet 1300. Also, the bottom cover 1400 may be formed of a metal material or a resin material, but is not limited thereto.

The light emitting module 1000 may include a substrate and a plurality of light emitting device packages mounted on the substrate. The plurality of light emitting device packages according to an embodiment may provide light to the light guide member 1100.

As shown in FIG. 10, the light emitting module 1000 may be disposed on at least one surface of inner side surfaces of the bottom cover 1400, and thus, the light emitting module 1100 may provide light toward at least one side surface of the light guide member 1100.

Alternatively, the light emitting module 1000 may be disposed on a bottom surface of the bottom cover 1400 to provide light toward a bottom surface of the light guide member 1100. Since this may be variously varied according to a design of the backlight unit, the present disclosure is not limited to the above-described structure.

The light guide member 1100 may be disposed inside the bottom cover 1400. The light guide member 1100 may receive the light provided from the light emitting module 1000 to produce planar light, and then guide the planar light to a display panel (not shown).

When the light emitting module 1000 is disposed on the side surface of the light guide member 1100, the light guide member 1100 may be a light guide panel (LGP).

For example, the light guide panel (LGP) may be formed of one of an acryl-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

When the light emitting module 1000 is disposed on the bottom surface of the light guide member 1100, the light guide member 1100 may include at least one of the light guide panel or the optical sheet.

For example, the optical sheet may include at least one of a diffusion sheet, a light collection sheet, and a brightness enhanced sheet. For example, the diffusion sheet, the light collection sheet, and the brightness enhanced sheet may be sequentially stacked to form the optical sheet. In this case, the diffusion sheet may uniformly diffuse light emitted from the light emitting module 1000, and then the diffused light may be collected into the display panel (not shown) by the light collection sheet. Here, the light emitted from the light collection sheet is randomly polarized light. The bright enhanced sheet may enhance a degree of polarization of the light emitted from the light collection sheet. For example, the light collection sheet may be a horizontal and/or vertical prism sheet. Also, the bright enhanced sheet may be a dual brightness enhancement film.

The reflective sheet 1300 may be disposed under the light guide member 1100. The reflective sheet 1300 may reflects the light emitted through the bottom surface of the light guide member 1100 toward a light emitting surface of the light guide member 1100.

The reflective sheet 1300 may be formed of a material having superior reflectance, e.g., a PET resin, a PC resin, or a PVC resin, but is not limited thereto.

FIG. 10 is a view of a lighting unit 1100 using a light emitting device 200 according to an embodiment. The lighting unit of FIG. 11 is an example of a light unit, but is not limited thereto.

Figure 11:
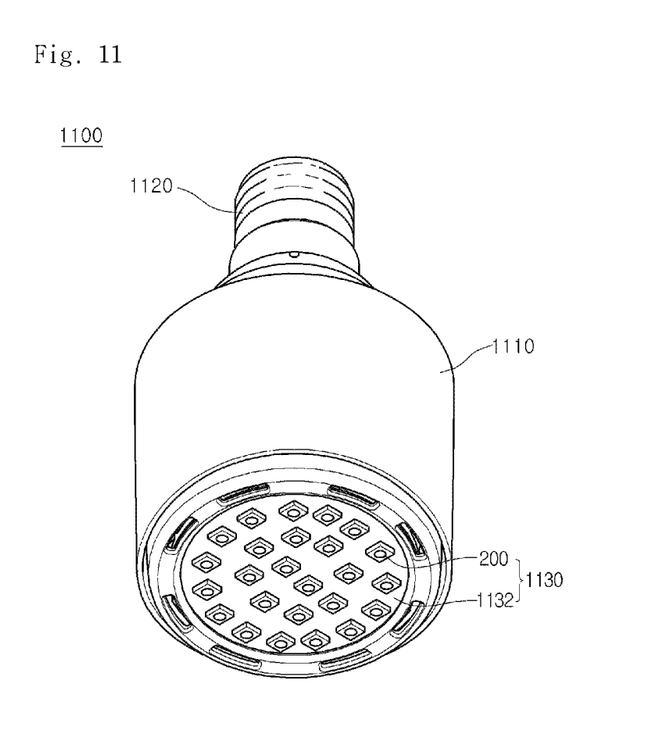

Referring to FIG. 11, the lighting unit 1100 may include a case body 1110, a light emitting module 1130 disposed on the case body 1110, a connection terminal 1120 disposed on the case body 1110 to receive a power from an external power source.

The case body 1110 may be formed of a material having good thermal dissipation properties, e.g., a metal material or a resin material.

The light emitting module 1230 may include a board 1132 and at least one light emitting device package 200 mounted on the board 1132.

A circuit pattern may be printed on a dielectric to form the board 1132. For example, the board 1132 may include a printed circuit board (PCB), a metal core PCB, a flexible PCB, and a ceramic PCB.

Also, the board 1132 may be formed of an effectively reflective material or have a color on which light is effectively reflected from a surface thereof, e.g., a white color or a silver color.

At least one light emitting device package 200 may be mounted on the board 1132. The light emitting device package 200 may include at least one light emitting diode (LED). The LED may include colored LEDs, which respectively emit light having a red color, a green color, a blue color, and a white color and an ultraviolet (UV) LED emitting UV rays.

The light emitting module 1130 may have various combinations of the LEDs to obtain color impression and brightness. For example, the white LED, the red LED, and the green LED may be combined with each other to secure a high color rendering index (CRI).

The connection terminal 1120 may be electrically connected to the light emitting module 1130 to provide a power to the light emitting module 1230. Referring to FIG. 8, the connected terminal 1120 is screw-coupled to an external power source in a socket manner, but is not limited thereto. For example, the connection terminal 1120 may have a pin shape, and thus, be inserted into the external power source. Alternatively, the connection terminal 1120 may be connected to the external power source by an interconnection.

The embodiments may provide the light emitting device having a new structure, the method for fabricating the light emitting device, the light emitting device package, and the lighting unit.

The embodiments may also provide the light emitting device having the improved light extraction efficiency and the method for fabricating the light emitting device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a first conductive type semiconductor layer having a first top surface and a second top surface under the first top surface;
   an active layer on the first top surface of the first conductive type semiconductor layer;
   a second conductive type semiconductor layer on the active layer;
   a first electrode on the second top surface of the first conductive type semiconductor layer;
   an intermediate refractive layer on the second top surface of the first conductive type semiconductor layer; and
   a second electrode connected to the second conductive type semiconductor layer,
   wherein the intermediate refractive layer is formed of a conductive material and spaced from the second electrode, and
   wherein the first electrode is spaced from the intermediate refractive layer inside the second top surface of the first conductive type semiconductor layer.

2. The light emitting device of claim 1, wherein the intermediate refractive layer is formed of at least one selected from a group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), and gallium zinc oxide (GZO).

3. The light emitting device of claim 1, wherein the intermediate refractive layer has a thickness corresponding to about an integer number times of $\lambda/4n$,
where $\lambda$ is a wavelength of light emitted from the active layer and n is a refractive index of the intermediate refractive layer.

4. The light emitting device of claim 3, wherein the intermediate refractive layer has a thickness of about 60 nm to about 100 nm.

5. The light emitting device of claim 1, wherein the intermediate refractive layer has a width of about 5 µm to about 100 µm.

6. The light emitting device of claim 1, wherein the intermediate refractive layer partially contacts the first electrode.

7. The light emitting device of claim 1, wherein the intermediate refractive layer ohmic-contacts the second top surface of the first conductive type semiconductor layer.

8. The light emitting device of claim 1, further comprising a transparent electrode layer on the second conductive type semiconductor layer,
wherein the second electrode is disposed on the transparent electrode layer.

9. The light emitting device of claim 8, wherein the intermediate refractive layer and the transparent electrode layer are formed of the same material as each other.

10. The light emitting device of claim 1, wherein the intermediate refractive layer comprises a light-transmitting conductor.

11. The light emitting device of claim 1, wherein the intermediate refractive layer has a thickness less than that of the first electrode.

12. The light emitting device of claim 1, wherein the first electrode and the intermediate refractive layer are directly contacted with the second top surface of the first conductive type semiconductor layer.

13. The light emitting device of claim 1, wherein the intermediate refractive layer is spaced from the first electrode in the second top surface of the first conductive type semiconductor layer.

14. The light emitting device of claim 1, wherein the intermediate refractive layer has a refractive index between a refractive index of the first conductive type semiconductor layer and a refractive index of a resin material or air.

15. A light emitting device package comprising:
a body;
a first and a second electrode layers on the body;
a light emitting device on the body, the light emitting device being electrically connected to the first and the second electrode layers; and
a molding member covering the light emitting device,
wherein the light emitting device comprises:
a first conductive type semiconductor layer having a first top surface and a second top surface under the first top surface;
an active layer on the first top surface of the first conductive type semiconductor layer;
a second conductive type semiconductor layer on the active layer;
a first electrode on the second top surface of the first conductive type semiconductor layer;
an intermediate refractive layer on the second top surface of the first conductive type semiconductor layer; and
a second electrode connected to the second conductive type semiconductor layer, wherein the intermediate refractive layer is formed of a conductive material and spaced from the second electrode, and
wherein the first electrode is spaced from the intermediate refractive layer inside the second top surface of the first conductive type semiconductor layer.

16. The light emitting device package of claim 15, wherein the intermediate refractive layer is formed of at least one selected from a group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), and gallium zinc oxide (GZO).

17. The light emitting device package of claim 15, wherein the intermediate refractive layer has a thickness corresponding to about an integer number times of $\lambda/4n$,
where $\lambda$ is a wavelength of light emitted from the active layer and n is a refractive index of the intermediate refractive layer.

18. The light emitting device package of claim 15, wherein the intermediate refractive layer has a thickness of about 60 nm to about 100 nm.

19. The light emitting device package of claim 15, further comprising a transparent electrode layer on the second conductive type semiconductor layer.

20. A lighting system comprising:
a board;
the light emitting device package of claim 15, the light emitting device being disposed on the board.

21. The light emitting device package of claim 15, wherein the first electrode and the intermediate refractive layer are directly contacted with the second top surface of the first conductive type semiconductor layer.

22. The light emitting device package of claim 15, wherein the intermediate refractive layer is spaced from the first electrode in the second top surface of the first conductive type semiconductor layer.

23. The light emitting device package of claim 15, wherein the intermediate refractive layer has a refractive index between a refractive index of the first conductive type semiconductor layer and a refractive index of a resin material or air.

24. A light emitting device comprising:
a first conductive type semiconductor layer having a first top surface and a second top surface under the first top surface;
an active layer on the first top surface of the first conductive type semiconductor layer;
a second conductive type semiconductor layer on the active layer;
a first electrode on the second top surface of the first conductive type semiconductor layer;
an intermediate refractive layer on the second top surface of the first conductive type semiconductor layer; and
a second electrode connected to the second conductive type semiconductor layer,
wherein the first electrode is spaced from the intermediate refractive layer inside the second top surface of the first conductive type semiconductor layer.

25. The light emitting device of claim 24, wherein the intermediate refractive layer has a refractive index between a refractive index of the first conductive type semiconductor layer and a refractive index of a resin material or air.

* * * * *